United States Patent [19]
Sato

[11] Patent Number: 5,719,514
[45] Date of Patent: Feb. 17, 1998

[54] DELAY CIRCUIT COMPENSATING FOR VARIATIONS IN DELAY TIME

[75] Inventor: Yu Sato, Tokyo, Japan

[73] Assignee: Ando Electric Co., Ltd., Tokyo, Japan

[21] Appl. No.: 621,969

[22] Filed: Mar. 26, 1996

[30] Foreign Application Priority Data

| Mar. 31, 1995 | [JP] | Japan | 7-100303 |
| Jun. 26, 1995 | [JP] | Japan | 7-182084 |
| Jun. 26, 1995 | [JP] | Japan | 7-182085 |

[51] Int. Cl.$^6$ .............. H03K 5/13; H03K 5/159
[52] U.S. Cl. .............. 327/262; 327/276; 327/244; 327/158
[58] Field of Search .............. 327/262, 261, 327/269, 270, 271, 272, 276, 277, 278, 285, 243, 244, 245, 236, 150, 153, 158, 161

[56] References Cited

U.S. PATENT DOCUMENTS

| 4,893,087 | 1/1990 | Davis | 327/156 |
| 4,899,071 | 2/1990 | Morales | 327/277 |
| 4,922,141 | 5/1990 | Lofgren et al. | 307/595 |
| 5,008,629 | 4/1991 | Ohba et al. | 327/156 |
| 5,039,893 | 8/1991 | Tomisawa | 327/277 |
| 5,105,108 | 4/1992 | Ngo | 307/603 |
| 5,146,121 | 9/1992 | Searles et al. | 307/603 |
| 5,216,302 | 6/1993 | Tanizawa | 307/603 |
| 5,252,867 | 10/1993 | Sorrells et al. | 327/271 |
| 5,338,990 | 8/1994 | Lou | 307/603 |
| 5,428,309 | 6/1995 | Yamauchi et al. | 327/158 |

FOREIGN PATENT DOCUMENTS

| 487902 | 6/1992 | European Pat. Off. | 327/161 |
| 6-224708 | 8/1994 | Japan | 327/175 |

*Primary Examiner*—Timothy P. Callahan
*Assistant Examiner*—Eunja Shin
*Attorney, Agent, or Firm*—Finnegan, Henderson, Farabow, Garrett & Dunner, L.L.P.

[57] ABSTRACT

A variable delay circuit is provided which automatically compensates for variations in delay time due to manufacturing variables. The construction is such that with variable delay gates (VD) of a reference delay time generation circuit (21), the delay time for one cycle of a designed reference clock signal (CK) is compensated using a phase comparison device (22) and a low pass filter (23). By arranging the reference delay time generation circuit (21) proximately to paths (121–124 and 141–144) which are weighted with the same variable delay gates (VD) as in the reference delay time generation circuit (21), the reference delay time generation circuit (21) and the paths (121–124 and 141–144) are given the same extent of variation. Hence variations in delay time can be compensated for using the same control signal CTR.

4 Claims, 9 Drawing Sheets

DELAY CIRCUIT COMPENSATING FOR VARIATIONS IN DELAY TIME

BACKGROUND OF THE INVENTION

1. Field of the Invention

This invention relates to a path switchable variable delay circuit which allows switching of the delay time by selecting one of a number of paths, each of which has a different delay time.

2. Background Art

An example of a conventional delay circuit configuration is shown in FIG. 9. In FIG. 9, numeral 11 refers to a first selector, which selectively connects a single input terminal to one of four output terminals. The four output terminals of the first selector 11 are connected to first, second, third and fourth paths 121–124 respectively.

The first path 121 has the largest number of delay gates D, and these are connected in series. The second path 122 has fewer delay gates D than the first path 121, with these also connected in series. The third path 123 has fewer delay gates D than the second path 122, with these also connected in series. The fourth path 124 is not equipped with any delay gates.

The output terminals of each of the paths 121–124 are connected respectively to four input terminals of a second selector 13. The second selector 13 selectively connects any one of the four input terminals to any one of four output terminals, with these four output terminals being connected to fifth, sixth, seventh and eighth paths 141–144 respectively.

The fifth path 141 has the largest number of delay gates D, and these are connected in series. The sixth path 142 has fewer delay gates D than the fifth path 141, with these also connected in series. The seventh path 143 has fewer delay gates D than the sixth path 142, with these also connected in series. The eighth path 144 is not equipped with any delay gates.

The output terminals of each of the paths 141–144 are connected to input terminals of a OR gate 15, and an output, which has been delayed by passage along the paths selected by the first and second selectors 11 and 13, is output via the OR gate 15.

The delay gates D used in each of the paths are identical, and by using the first and second selectors Go selectively connect any specific path, it is possible to select a delay time proportional to the number of delay gates in that selected path.

However, production of monolithic forms of the conventional path switchable delay circuits described above, results in the occurrence of variations in the gate delay due to temperature fluctuations, and irregularities in the delay time within a production batch. Consequently, obtaining of delay times identical to the design values is impossible, and the realization of an accurate delay circuit has been extremely difficult. Furthermore, once the monolithic circuit has been produced, changing the resolution is impossible.

SUMMARY OF THE INVENTION

It is an object of the present invention to provide a delay circuit in which the resolution can be set freely, and in which, by compensating for production and temperature variations, very accurate delay times can be set.

In order to achieve this object, the present invention comprises a multiple number of paths (121, 122, 123, 124, 141, 142, 143, 144) each of which contains a specific number of variable delay gates (VD) connected in series, path selection devices (11, 13, 15, 16, 17) for setting specific delay times by selectively connecting appropriate multiple paths, a reference delay time generation device (21) comprising variable delay gates (VD) identical to the variable delay gates (VD) employed in the multiple paths, connected in series and arranged proximately to the multiple paths, for delaying a reference clock signal (CK) by one cycle, a phase comparison device (22) for comparing the phases of the reference clock signal (CK) and the delay output from the reference delay time generation device (21), and a control signal generation device (23) for converting the output from the phase comparison device (22) to a delay time control signal (CTR) for the variable delay gates (VD), the configuration being such that the delay time control signal (CTR) controls the variable delay gates (VD) of the reference delay time generation device (21), and the variable delay gates (VD) of the multiple paths simultaneously.

With a delay circuit configured in this manner, the reference delay time generation device (21), comprising the variable delay gates (VD) identical to the variable delay gates (VD) employed in the multiple paths (121–124, 141–144), connected in series and in sufficient number to delay the reference clock signal (CK) by one cycle, is arranged proximately to the multiple paths (121–124, 141–144). The phases of the reference clock signal (CK) and the delay output from the reference delay time generation device (21) are compared and the size of the phase drift determined. A delay time control signal (CTR) is then generated to correct for the drift, and the variable delay gates (VD) of the reference delay time generation device (21) and the variable delay gates (VD) of the multiple paths are controlled, simultaneously, in accordance with this control signal. Because the reference delay time generation device (21) and the paths (121–124, 141–144) are arranged proximately to one another, they have the same extent of variation, and so by using the same delay time control signal (CTR) to control the variable delay gates (VD) in each of the paths, it is possible to control uniformly, and thus compensate for, variations in the delay time.

BEEF DESCRIPTION OF THE DRAWINGS

DETAILED DESCRIPTION OF THE PREFERRED EMBODIMENTS

The configuration of a preferred embodiment of the invention is explained with reference to FIG. 1. In this figure, elements which are the same as those in FIG. 9 are labelled identically, and the explanation here will focus on the different elements.

Figure 1:
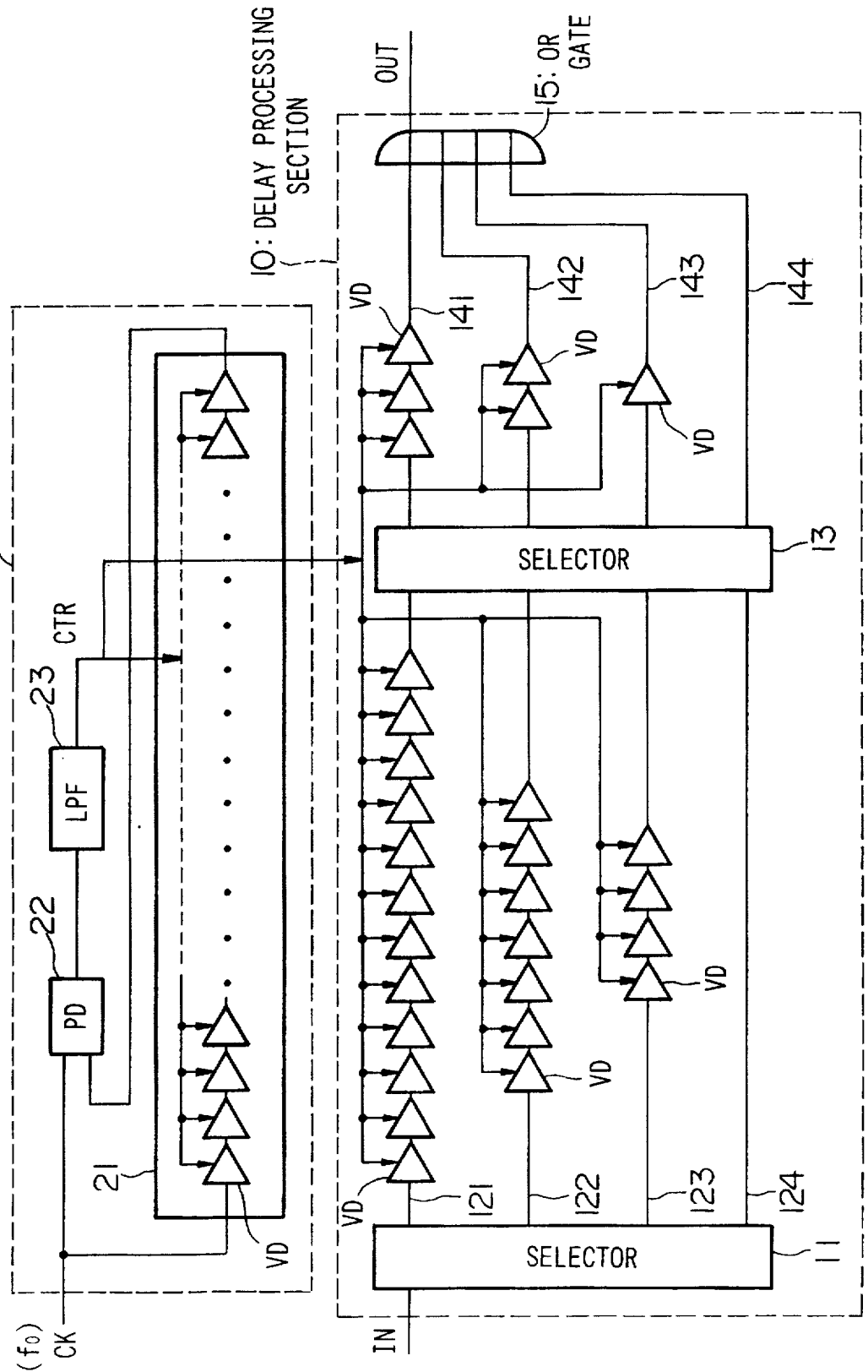
FIG. 1 is a circuit diagram showing the configuration of a first embodiment of the invention.
Figure 9:
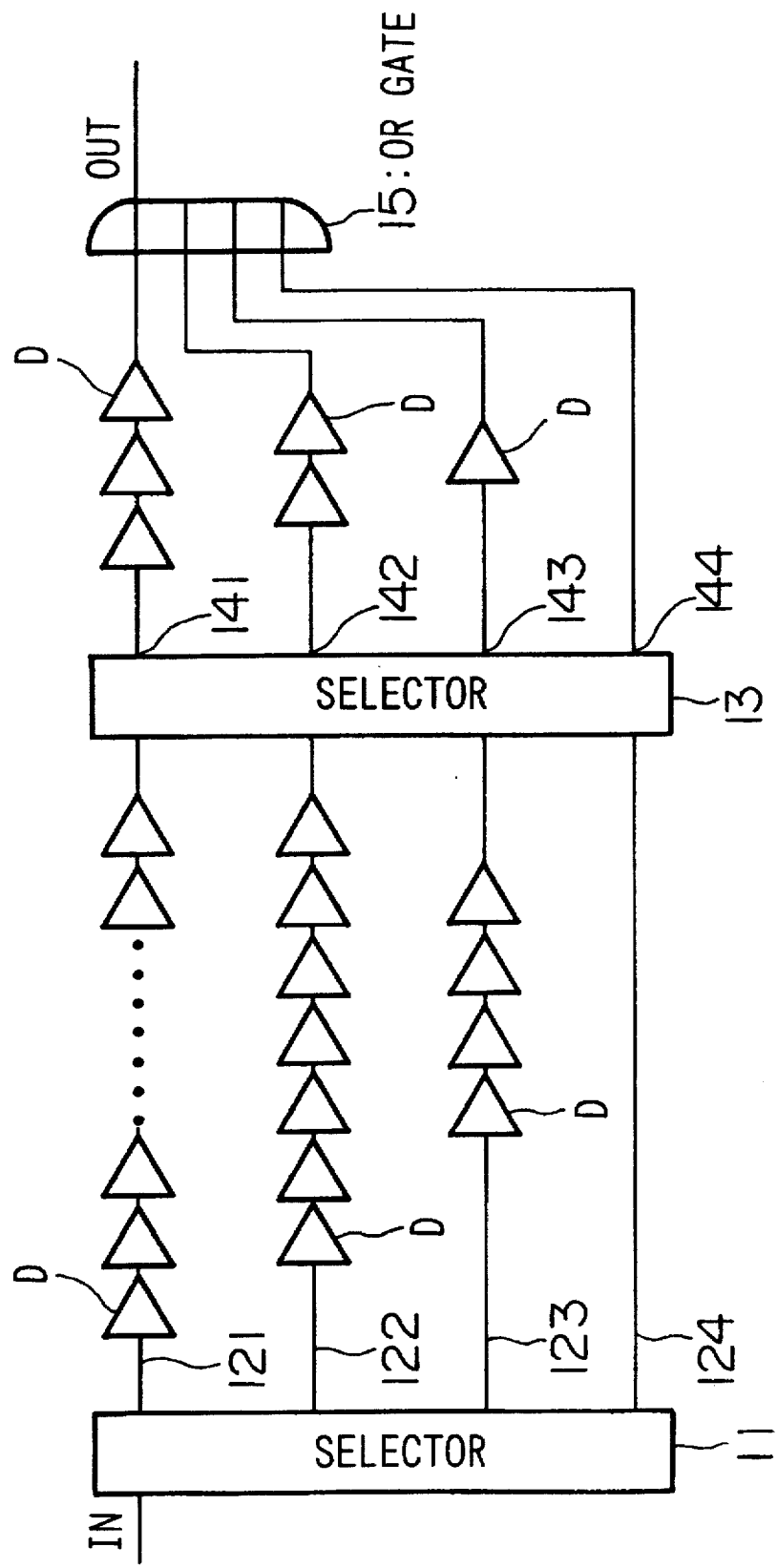
FIG. 9 is a circuit diagram showing an example configuration of a conventional delay circuit.

In FIG. 1, numeral 10 refers to a delay processing section, constructed in almost the same manner as the conventional circuit shown in FIG. 9. However, the eight paths 121–124 and 141–144 employ variable delay gates (VD), for which the delay time can be altered in accordance with an externally supplied control signal, and the control input terminals of each of these variable delay gates (VD) are commonly connected.

For the delay processing section 10, there is provided a delay time compensation section 20. The delay time compensation section 20 comprises a reference delay time generation circuit 21, a phase comparison device (PD) 22, and a low pass filter (LPF) 23.

The reference delay time generation circuit 21 consists of a sufficient number of variable delay gates VD, connected in series, to delay an externally applied reference clock signal CK (frequency f0) by one cycle. The variable delay gates VD used here are identical to the variable delay gates VD employed in the delay processing section 10.

The output from the reference delay time generation circuit 21 is supplied to the phase comparison device 22 where its phase is compared with that of the reference clock signal CK. The output from the phase comparison device 22 is converted to a DC voltage signal by the LPF 23, and is then supplied as a delay time control signal CTR to each of the variable control gates of the reference delay time generation circuit 21, as well as to each of the variable delay gates VD of the delay processing section 10.

Next is an explanation of the operation of the circuit of FIG. 1. First, in the delay time compensation section 20, the reference delay time generation circuit 21 is designed to a delay time of one cycle of the frequency f0 of the reference clock signal CK. In practice, the delay time varies from the design value, and adjustments are necessary. In such cases, the reference clock signal CK is delayed, by input into the reference delay time generation circuit 21, and the phases of the input and output compared using the phase comparison device 22. At this point, if the two phases match, then there is no output from the phase comparison device 22, but if the phases do not coincide, a signal equivalent to the amount of this drift is output to the LPF 23.

The LPF 23 converts the output from the phase comparison device 22 to a DC voltage signal by letting only the low frequency portion of the output pass through. This signal becomes the delay time control signal CTR, and controls each of the gates VD of the reference delay time generation circuit 21. That is, the delay times of each of the gates of the reference delay time generation circuit 21 change in accordance with this delay time control signal CTR, and are adjusted so that the total delay time is equivalent to one cycle of the reference clock frequency f0.

The delay time compensation section 20 of the above configuration is arranged near the previously mentioned delay processing section 10, and distributes and supplies the delay time control signal CTR output from the LPF 23, to each of the variable delay gates VD inside the delay processing section 10. In this way, because the paths of the reference delay time generation circuit 21 and the delay processing section 10 are arranged proximately to one another, they have the same amount of variation. Thus, by using the same delay time control signal CTR to control each of the variable delay gates VD, it is possible to control uniformly any variation. In this way, compensation is made for any variation in the production of the delay processing section 10.

A signal is input into the delay processing section 10, and in order to create a specific delay time, a suitable path is selected at each selector stage 11 and 13, from the paths 121–124 and 141–144. The delay time of the variable delay gates VD at each stage is adjusted automatically by the control signal CTR. Consequently, the signal output from the delay processing section 10 becomes an extremely accurately delayed signal.

Furthermore, in the embodiment of FIG. 1, the number of paths in the delay processing section 10, and the number of selector stages, can be increased or decreased as necessary.

Figure 2:
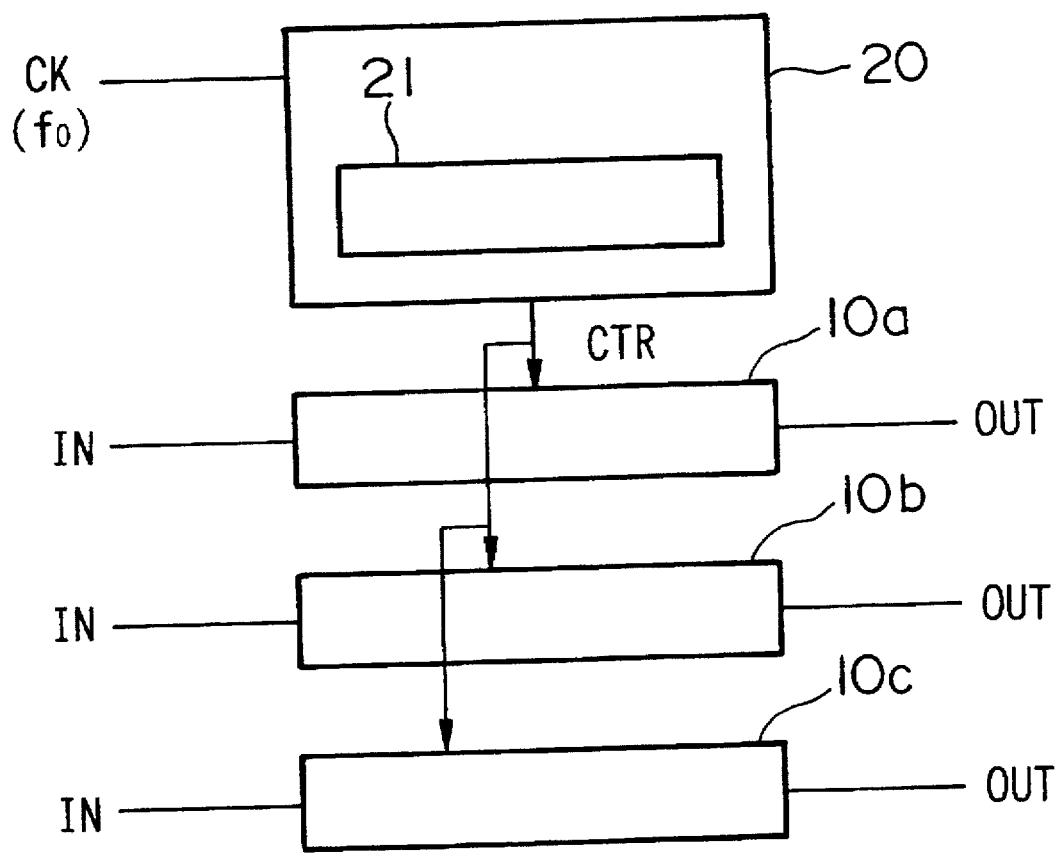
FIG. 2 is a circuit diagram showing the configuration of a second embodiment of the invention.
Figure 3:
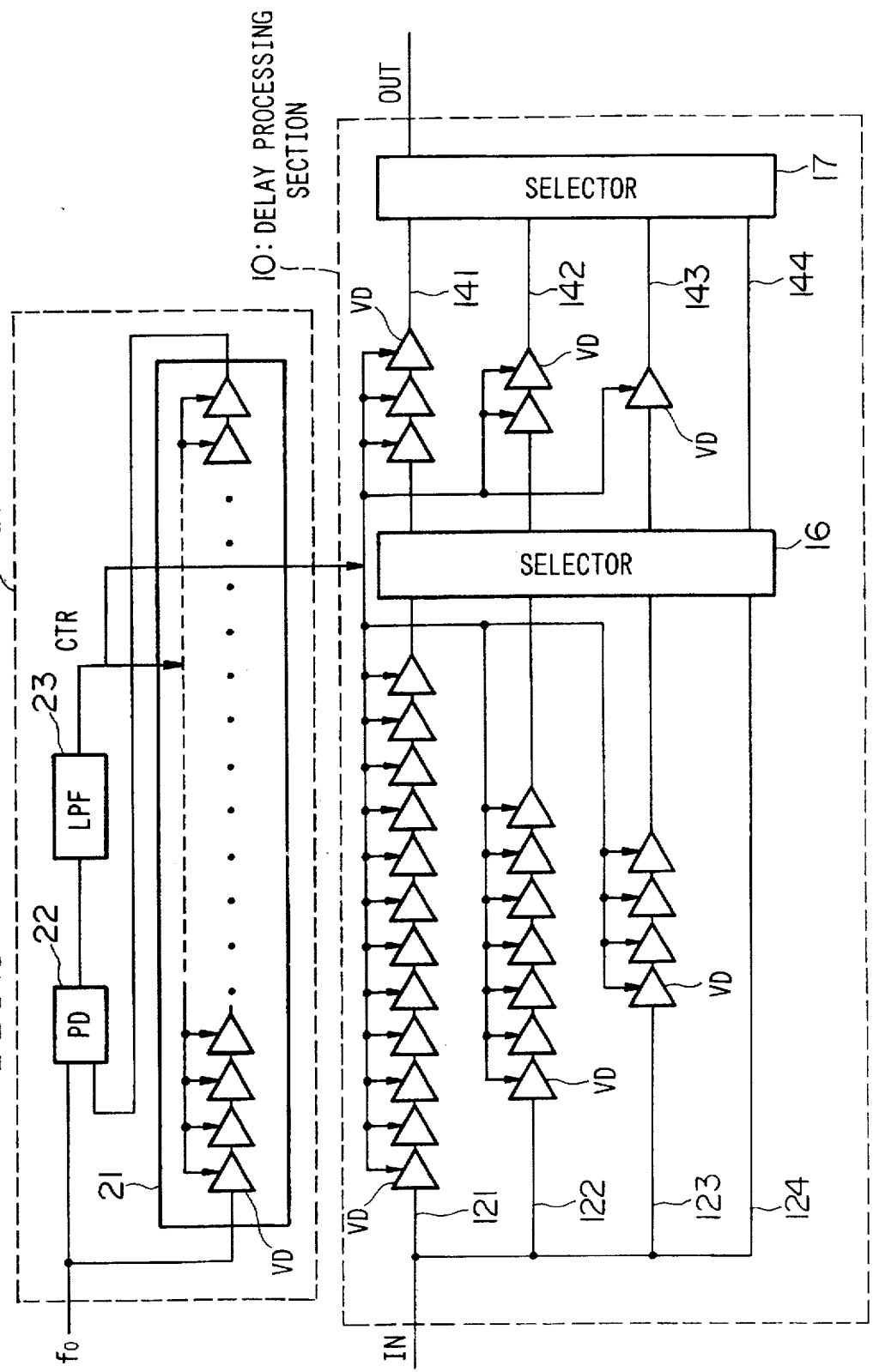
FIG. 3 is a circuit diagram showing the configuration of a third embodiment of the invention.

Other preferred embodiments of the invention are shown in FIGS. 2 and 3. In FIGS. 2 and 3, elements which are the same as those in FIG. 1 are labelled identically, and explanation will be given here of the different elements.

FIG. 2 shows a configuration for a delay circuit which is equipped with three delay processing sections 10a–10c, and to which this invention has been applied. It is configured with the reference delay time generation circuit 21 of the delay time compensation section 20 arranged proximately to the delay processing sections 10a–10c. Using this configuration, any variations in the variable delay gates VD of the three delay processing sections 10a–10c can be compensated for simultaneously.

FIG. 3 shows a configuration which does not employ the OR gate shown in FIG. 1, and where the input signal is distributed and provided to the four paths 121–124 in parallel, with the output from each of the paths 121–124 being supplied to a selector 16. The selector 16 selectively connects the four inputs to one of four output terminals. These output terminals are connected to fifth, sixth, seventh and eighth paths 141–144 respectively.

The output from the fifth, sixth, seventh and eighth paths 141–144, is supplied to a selector 17. The selector 17 selects one of the four inputs and outputs it, and this output becomes the main delay circuit output.

That is, in the delay circuit of this configuration, one of the signals from the paths 121–124 is selectively connected through to one of the paths 141–144 by the selector 16, and then one of the signals which has passed through the paths 141–144 is selected by the selector 17 and becomes the output for the delay processing section 10.

As was the case for the embodiment shown in FIG. 1, any variations in the variable delay gates VD of the paths 121–124 and 141–144 in this configuration, can be levelled out by using the control signal CTR from the delay time compensation section 20, which can automatically compensate for any variations in delay time.

Figure 4:
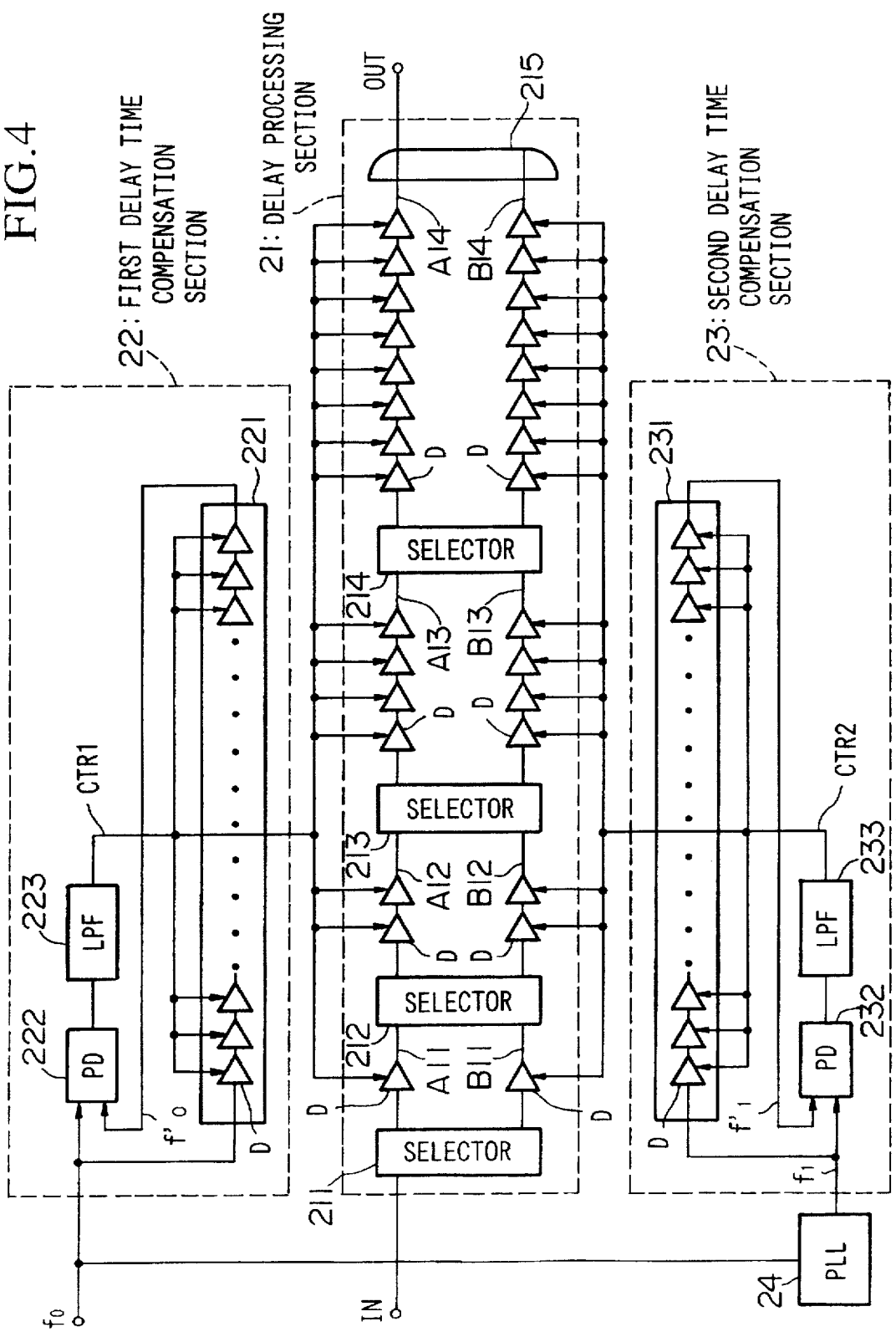
FIG. 4 is a circuit diagram showing the configuration of a fourth embodiment of the invention.

FIG. 4 shows a configuration of a four stage path switchable delay circuit of the invention. This delay circuit comprises a delay processing section 21 for carrying out delay processing of the input signal by path switching systems A and B, a first delay time compensation section 22 for compensating for variations and fluctuations in the delay times of the delay gates of the paths in system A, a second delay time compensation section 23 for compensating for variations and fluctuations in the delay times of the delay gates of the paths in system B, and a PLL (phase lock loop) circuit for determining the delay time for the system B paths in relation to the system A paths.

The delay processing section 21 is configured such that at each stage, the first paths A11–A14, and the second paths B11–B14 are selectively connected by selectors 211–214, and at the final stage, paths A14 and B14 are connected to the input terminal of an OR gate 215.

The input terminal of the selector 211 is connected to an input terminal IN, and the output terminal of the OR gate 215 is connected to an output terminal OUT. Furthermore, a total of 1, 2, 4, and 8 variable delay gates (all of identical construction) are included in each of the paths A11 and B11, A12 and B12, A13 and B13, and A14 and B14 respectively.

The first delay time compensation section 22 incorporates a delay time generation circuit 221 consisting of variable delay gates D identical to the variable delay gates D employed in the paths A11–A14 of system A, connected in series, and in sufficient number to delay the reference clock signal f0 by one cycle; a phase comparison device (PD) 222 for comparing the phases of the reference clock f0, and the reference clock f0' which has been delay processed in the delay time generation circuit 221; and a low pass filter (LPF) 223 for generating a DC voltage signal by allowing passage of the low frequency component of the output from the phase comparison device 222.

The output from the low pass filter 223 is supplied to the variable delay gates D of the delay time generation circuit 221 as the delay time control signal CTR1, and is also supplied, simultaneously, to the variable delay gates D of the paths A11–A14 of system A. The delay time generation circuit 221 is arranged proximately to the paths A11–A14 of system A of the delay processing section 21.

In the same manner, the second delay time compensation section 23 incorporates a delay time generation circuit 231 consisting of variable delay gates D identical to the variable delay gates D employed in the paths B11–B14 of system B, connected in series, and in sufficient number to delay the reference clock signal f1 by one cycle; a phase comparison device (PD) 232 for comparing the phases of the reference clock f1, and the reference clock f1' which has been delay processed in the delay time generation circuit 231; and a low pass filter (LPF) 233 for generating a DC voltage signal by allowing passage of the low frequency component of the output from the phase comparison device 232.

The output from the low pass filter 233 is supplied to the variable delay gates D of the delay time generation circuit 231 as the delay time control signal CTR2, and is also supplied, simultaneously, to the variable delay gates D of the paths B11–B14 of system B. The delay time generation circuit 231 is arranged proximately to the paths B11–B14 of system B of the delay processing section 21.

Moreover, the number of variable delay gates in the delay time generation circuit 221 of the first delay time compensation section 22 is made equal to the number of variable delay gates in the delay time generation circuit 231 of the second delay time compensation section 23.

Figure 5:
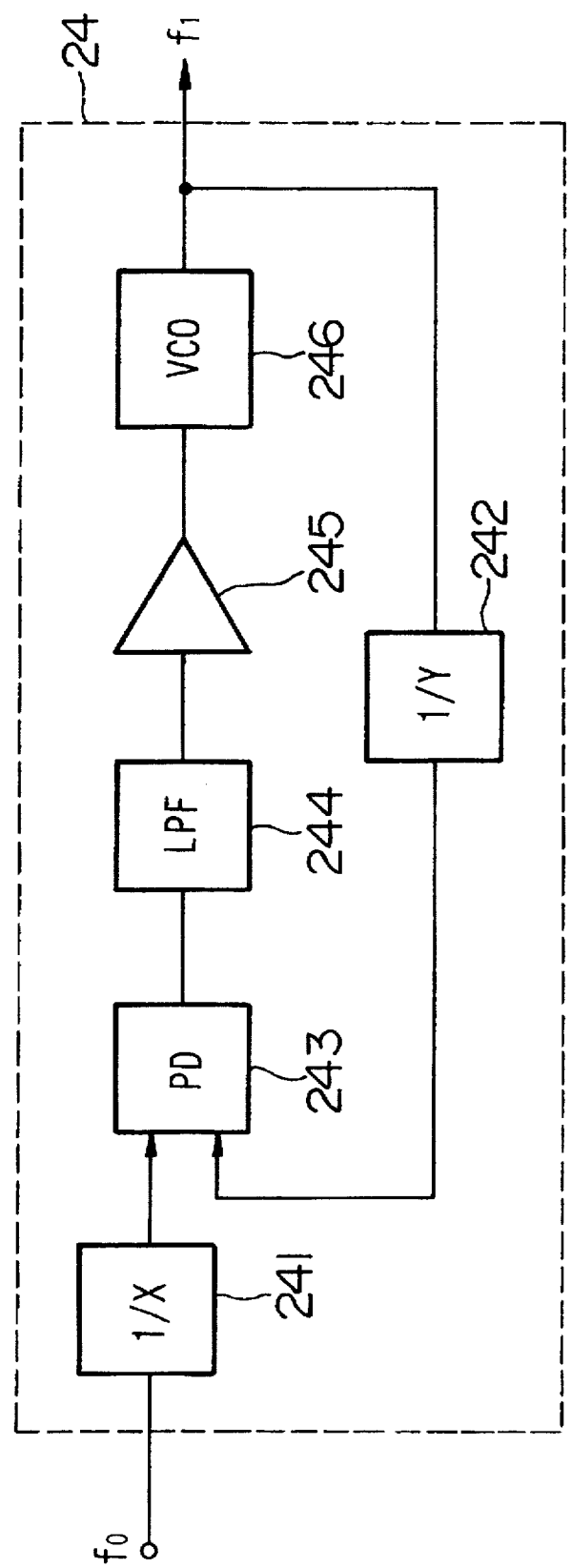
FIG. 5 is a circuit diagram showing the configuration of a PLL circuit 24 appearing in FIG. 4.

The PLL circuit 24 generates the reference clock f1 from the reference clock f0, and is constructed as shown in FIG. 5.

In FIG. 5, the reference clock f0 is X divided by a frequency divider 241 (1/X), and is then input, together with a clock arising from Y dividing the output clock f1 by a frequency divider 242 (1/Y), into a phase comparison device (PD) 243. The phase comparison device 243 compares the phases of the two inputs, and outputs a phase error signal, and this phase error signal, following conversion to a DC voltage signal by a low pass filter (LPF) 244, is amplified by an amplifier 245, and then supplied as a voltage control signal to a voltage control oscillator (VCO) 246.

The voltage control oscillator 246 generates a frequency, clock f1, in accordance with a control voltage signal, and this clock f1 is then supplied to the frequency divider 242, and is also supplied to the second delay time compensation section 23 as the output clock f1.

Next is an explanation of the operation of the above types of configurations. First, in the PLL circuit 24, the input reference clock f0 is X divided by the frequency divider 241, and its phase then compared with the signal arising from Y dividing the output clock f1 by the frequency divider 242, using the phase comparison device 243. At this point, if the two phases match there is no output, but if they do not coincide, a phase error signal equivalent to the amount of drift is output.

This phase error signal is converted to a DC voltage signal by extraction of the low frequency portion of the signal by the low pass filter 244. This signal is then amplified by the amplifier 245, and the amplified signal used to oscillate the voltage control oscillator 246. The oscillation frequency of the voltage control oscillator 246 is the output clock f1 of the PLL circuit 24. As mentioned previously, the output clock f1 is Y divided by the frequency divider 242 and then supplied to the phase comparison device 243.

For operation in the manner described above, the input and output of the PLL circuit 24 is controlled so that:

$$f0/X = f1/Y \tag{1}$$

Thus, the output f1 of the PLL circuit 24 is fixed at a frequency of Y/X times that of the input f0.

In the delay processing section 21, delay processing is carried out for the delay times of each stage, up to and including the final stage, by utilizing the delay time difference between the variable delay gates D, controlled by the first delay time compensation section 22, and the variable delay gates D, controlled by the second delay time compensation section 23.

The delay time generation circuit 221 of the first delay time compensation section 22 is designed to a delay time of one cycle of the reference clock f0. Furthermore, the delay time generation circuit 231 of the second delay time compensation section 23 is designed to a delay time of one cycle of the reference clock f1, which has been converted from the reference clock f0 by the PLL circuit 24.

In practice, the delay times of the delay time generation circuits 221 and 231 fluctuate and vary from the design values due to temperature, and require compensation. To achieve this, the reference clock f0 is input into the delay time generation circuit 221 and delayed by one cycle, and the phases of the output and the original input then compared using the phase comparison device 222. At this point, if the two phases match then the phase comparison device 222 generates no output, but if the phases do not coincide, a phase error signal equivalent to the amount of drift is output to the low pass filter 223.

The low pass filter 223 converts the output from the phase comparison device 222 to a DC voltage signal by allowing only the low frequency component of the output to pass through. This DC voltage signal is the delay time control signal CTR1, and controls the various variable delay gates D of the delay time generation circuit 221. That is, the delay time of the delay time generation circuit 221 is adjusted by using the delay time control signal CTR1 to control the delay times of the various gates, and create an overall delay time equivalent to one cycle of the reference clock f0.

The delay time generation circuit 221 is located proximately to the paths A11–A14 of system A of the delay processing section 21, and the delay time control signal CTR1 output from the low pass filter 223 is also distributed and supplied to each of the variable delay gates D of the paths A11–A14. Because the delay time generation circuit 221 and the paths A11–A14 are arranged proximately, any variation should be of the same level.

Consequently, by controlling the variable delay gates D of the paths A11–A14 with the same delay time control signal CTR1, it is possible to always have the delay time matching the design value, regardless of variations or alterations in temperature.

Similarly, for the second delay time compensation section 23, the clock f1 is input into the delay time generation circuit 231 and delayed by one cycle. The phases of the output and the original input are then compared using the phase comparison device 232 and a phase error signal generated. This signal is then converted to a DC voltage signal by the low pass filter 233, and serves as the delay time control signal CTR2 for controlling the various variable delay gates D of the delay time generation circuit 231.

That is, the delay time of the delay time generation circuit 231 is adjusted by using the delay time control signal CTR2 to control the delay times of the various gates, and create an overall delay time equivalent to one cycle of the clock f1.

The delay time generation circuit 231 is located proximately to the paths B11–B14 of system B, and the delay time control signal CTR2 output from the low pass filter 233 is also distributed and supplied to each of the variable delay gates D of the paths B11–B14. Because the delay time generation circuit 231 and the paths B11–B14 are arranged proximately, any variation should be of the same level.

Consequently, by controlling the variable delay gates D of the paths B11–B14 with the same delay time control signal CTR2, it is possible to always have the delay time matching the design value, regardless of variations or alterations in temperature.

The resolution of this delay circuit is the difference between the delay time of a single variable delay gate D controlled by the first delay time compensation section 22, and a single variable delay gate D controlled by the second delay time compensation section 23. For each gate, compensation is carried out for any variations in construction and temperature, thus allowing compensation of the resolution.

If the number of variable delay gates D in the first and second delay time compensation sections 22 and 23 is termed N, then the delay time of a single variable delay gate D of the first delay time compensation section 22 becomes (1/f0*1/N), and the delay time of a single variable delay gate D of the second delay time compensation section 23 becomes (1/f1*1/N). From this, and by employing equation 1, it is clear that the resolution φ of the delay circuit is represented by:

$$\phi = (1/f0 * 1/N) - (1/f1 * 1/N) \quad (2)$$
$$= (1 - X/Y) * (1/f0 * 1/N)$$

Consequently, the resolution can be readily altered by setting the frequency dividers 241, 242 of the PLL 24 to specific values.

In order to generate a specific delay time from the signal input into the delay processing section 21 mentioned above, suitable paths are chosen from the paths A11–A14 and B11–B14, by the various selectors 211–214. The delay times of the various variable delay gates D are adjusted automatically by the delay time control signals CTR1 and CTR2. As a result, the output signal from the delay processing section 21 becomes an extremely accurately delayed signal.

Consequently, with delay circuits constructed in this manner, resolution can be set readily, and extremely accurate delay times can be set by compensating for any construction and temperature variations. Furthermore, in the embodiment shown in FIG. 1, the number of selectors in the delay processing section 21, and the number of variable delay gates in each stage can be increased or decreased as required.

Figure 6:
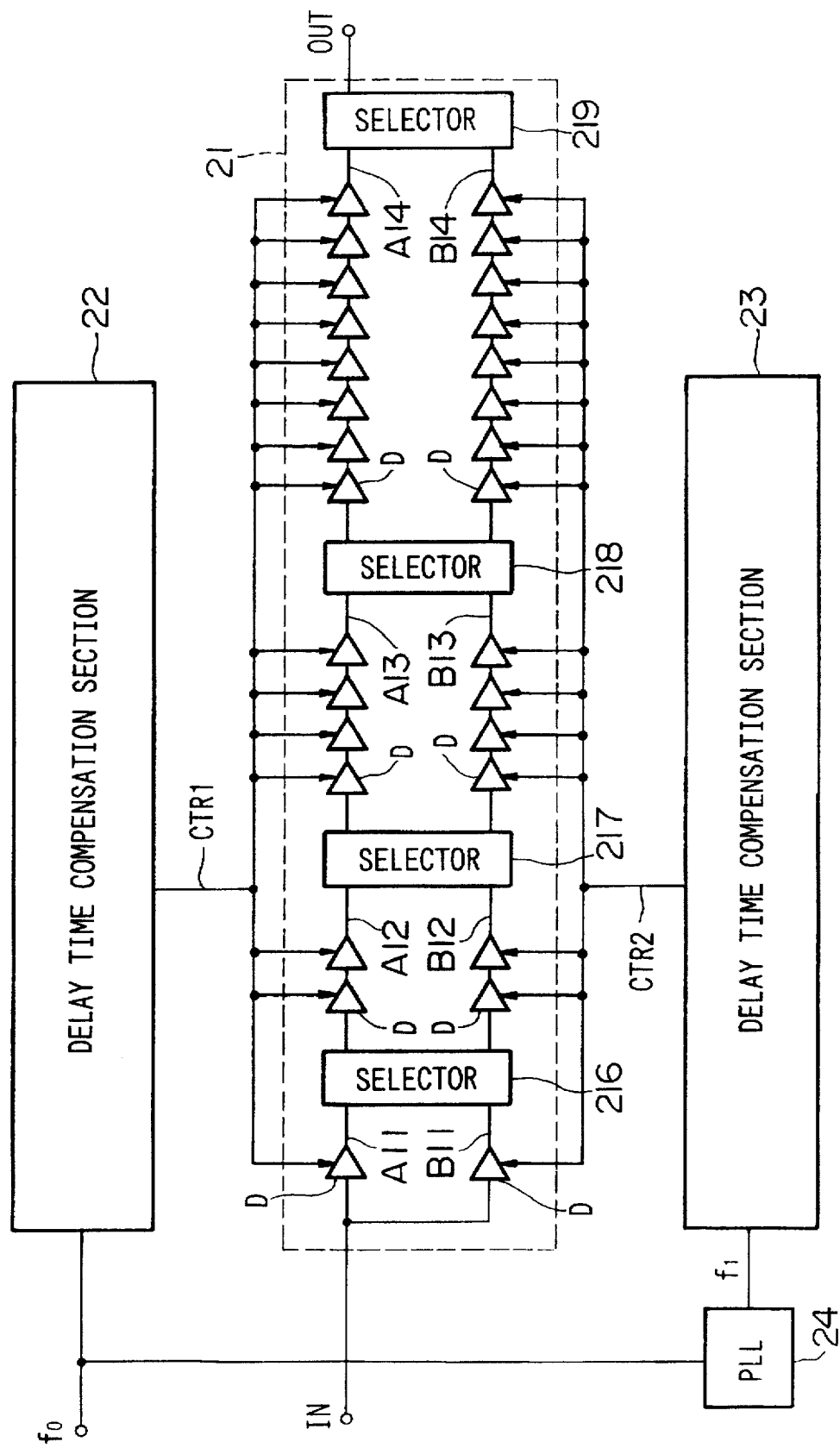
FIG. 6 is a circuit diagram showing the configuration of a fifth embodiment of the invention.

FIG. 6 shows an example configuration of another embodiment of the delay circuit of this invention. In this figure, elements which are the same as those in FIG. 4 are labelled identically, and their explanations here are abbreviated. Comparison with FIG. 4 shows clearly that in the delay circuit shown in FIG. 6, the path selection configuration of the delay processing section 21 differs. Namely, the delay processing section 21 contains both two input two output type selectors 216–218 (one of the two inputs produces two outputs), as well as a single input single output selector 219, for the selection of paths A11–A14 and B11–B14.

In FIG. 6, the input signal supplied to the input terminal IN passes directly through both the paths A11 and B11 and is input into the selector 216, where one of the two signals is selected and then output to both the paths A12 and B12.

Similarly, the transmission signals from the paths A12 and B12 are input into the selector 217, where one of the two signals is selected and then output to both the paths A13 and B13. The transmissions signals from the paths A13 and B13 are then input into the selector 218, where one of the two signals is selected and then output to both the paths A14 and B14. The transmissions signals from the paths A14 and B14 are then input into the selector 219, where one of the two signals is selected and then output to the output terminal OUT.

In configurations of this type, as was the case for the embodiment shown in FIG. 4, any variations in the variable delay gates D of the paths A11–A14 can be compensated for by the delay time compensation signal CTR1 from the first delay time compensation section 22, and any variations in the variable delay gates D of the paths B11–B14 can be compensated for by the delay time compensation signal CTR2 from the second delay time compensation section 23. Furthermore, the resolution of the delay circuit, calculated as the difference in the delay time between a single variable delay gate D from each of the two delay time generation circuits 221 and 231, can be compensated for any variation due to construction or temperature.

In this embodiment, as was the case for the previous embodiments, the number of selectors in the delay processing section 21, and the number of variable delay gates in each stage can be increased or decreased as required. Furthermore, although two path systems were used in all of the embodiments, configurations with a greater number of path systems can also be used. In such cases, as long as a delay time compensation section is provided for each path system, and the input clock for each of the delay time compensation sections is generated from the reference clock by the PLL circuit, the same effect can be obtained.

Figure 7:
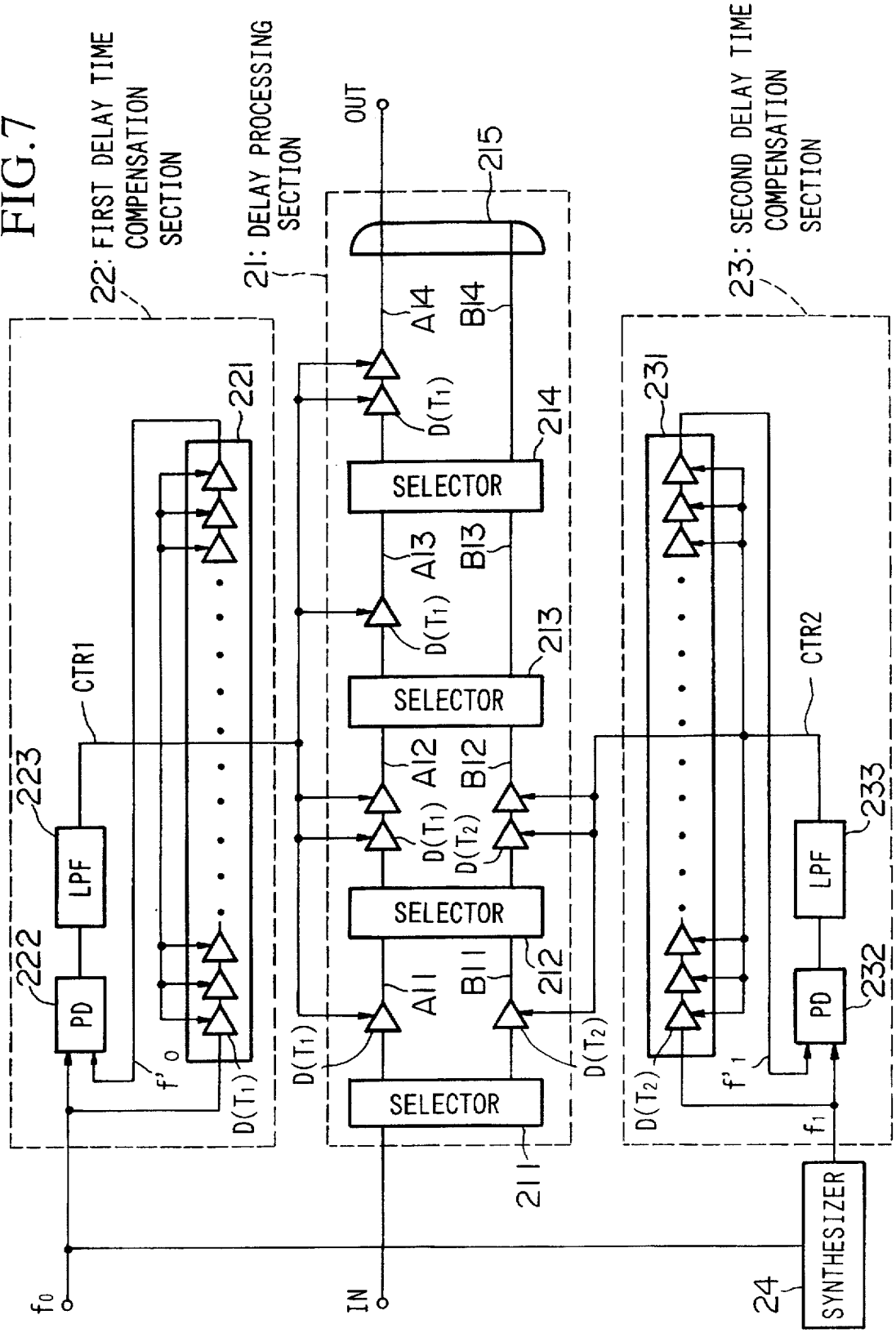
FIG. 7 is a circuit diagram showing the configuration of a sixth embodiment of the invention.

FIG. 7 shows a further example configuration of a four stage path switchable delay circuit of this invention. This delay circuit comprises a delay processing section 21, for carrying out delay processing of the input signal by path switching systems A and B, a first delay time compensation section 22 for compensating for variations and fluctuations in the delay times of the delay gates of the paths in system A, a second delay time compensation section 23 for compensating for variations and fluctuations in the delay times of the delay gates of the paths in system B, and a synthesiser 24 for setting the delay time of the paths of system B, relative to the paths of system A.

The delay processing section 21 is configured such that at each stage, the system A paths A11–A14, and the system B paths B11–B14 are selectively connected by selectors 211–214, and at the final stage, paths A14 and B14 are connected to the input terminal of an OR gate 215.

The input terminal of the selector 211 is connected to an input terminal IN, and the output terminal of the OR gate 215 is connected to an output terminal OUT. Furthermore, the paths A11–A14 contain a certain number of delay gates D(T1) with delay times of T1, and the paths B11–B14 contain a certain number of delay gates D(T2) with delay times of T2. In this particular example the number of gates in the paths A11–A14 is 1, 2, 1 and 2 respectively, and the number of gates in the paths B11–B14 is 1, 2, 0 and 0 respectively.

The first delay time compensation section 22 incorporates a delay time generation circuit 221 consisting of variable delay gates D(T1) identical to the variable delay gates D(T1) employed in the paths A11–A14 of system A, connected in series, and in sufficient number to delay the reference clock signal f0 by one cycle; a phase comparison device (PD) 222 for comparing the phases of the reference clock f0, and the reference clock f0' which has been delay processed in the delay time generation circuit 221; and a low pass filter (LPF) 223 for generating a DC voltage signal by allowing passage of the low frequency component of the output from the phase comparison device 222.

The output from the low pass filter 223 is supplied to the variable delay gates D(T1) of the delay time generation circuit 221 as the delay time control signal CTR1, and is also supplied, simultaneously, to the variable delay gates D(T1) of the paths A11–A14 of system A. The delay time generation circuit 221 is arranged proximately to the paths A11–A14 of system A of the delay processing section 21.

In the same manner, the second delay time compensation section 23 incorporates a delay time generation circuit 231, consisting of variable delay gates D(T2) identical to the variable delay gates D(T2) employed in the paths B11–B14 of system B, connected in series, and in sufficient number to delay the reference clock signal f1 by one cycle; a phase comparison device (PD) 232 for comparing the phases of the reference clock f1, and the reference clock f1' which has been delay processed in the delay time generation circuit 231; and a low pass filter (LPF) 233 for generating a DC voltage signal by allowing passage of the low frequency component of the output from the phase comparison device 232.

The output from the low pass filter 233 is supplied to the variable delay gates D(T2) of the delay time generation circuit 231 as the delay time control signal CTR2, and is also supplied, simultaneously, to the variable delay gates D(T2) of the paths B11–B14 of system B. The delay time generation circuit 231 is arranged proximately to the paths B11–B14 of system B of the delay processing section 21.

Moreover, the number of variable delay gates in the delay time generation circuit 221 of the first delay time compensation section 22 is equal to the number of variable delay gates in the delay time generation circuit 231 of the second delay time compensation section 23.

The synthesiser 24 generates a specified frequency clock f1 from the reference clock f0 and outputs it to the second delay time compensation section 23.

Next is an explanation of the operation of the above configuration. The delay time generation circuit 221 of the first delay time compensation section 22 is designed to a delay time of one cycle of the reference clock f0. Furthermore, the delay time generation circuit 231 of the second delay time compensation section 23 is designed to a delay time of one cycle of the reference clock f1, which has been converted from the reference clock f0 by the synthesiser 24.

If the delay time difference between the paths A13 and B13 is considered to be 1, then the paths A11 and B11, A12 and B12, and A14 and B14 have delay time differences of ¼, ½, and 2 respectively. Consequently, the relationship between clock f0 and f1 is f1=4/3*f0 when passage through path B11 is faster than passage through path A11, and f1=4/5*f0 when passage through path B11 is slower than passage through path A11.

If the delay processing section 21 contains N stages, and if the stage where the delay time difference is equivalent to one variable delay gate D(T1) controlled by the delay time compensation section 22 is stage M when counted from the back, then in general $$f1/f0=2^{N-M}/(2^{N-M}\pm1) \qquad (3)$$

In equation 1, the polarity signal becomes a plus sign when the delay time T2 of the variable delay gates D(T2) of path B11 is greater than the delay time T1 of the variable delay gates D (T1) of path A11. Conversely, the polarity signal becomes a minus sign when the delay time T2 of the variable delay gates D(T2) of path B11 is less than the delay time T1 of the variable delay gates D(T1) of path A11.

In practice, the delay times of the delay time generation circuits 221 and 231 fluctuate and vary from the design values due to temperature, and require compensation. To achieve this, the reference clock f0 is input into the delay time generation circuit 221 and delayed by one cycle, and the phases of the output and the original input then compared using the phase comparison device 222. At this point, if the two phases match then the phase comparison device 222 generates no output, but if the phases do not coincide, a phase error signal equivalent to the amount of drift is output to the low pass filter 223.

The low pass filter 223 converts the output from the phase comparison device 222 to a DC voltage signal by allowing only the low frequency component of the output to pass through. This DC voltage signal is the delay time control signal CTR1, and controls the various variable delay gates D(T1) of the delay time generation circuit 221. That is, the delay time of the delay time generation circuit 221 is adjusted by using the delay time control signal CTR1 to control the delay times of the various gates, and create an overall delay time equivalent to one cycle of the reference clock f0.

The delay time generation circuit 221 is located proximately to the paths A11–A14 of system A of the delay processing section 21, and the delay time control signal CTR1 output from the low pass filter 223 is also distributed and supplied to each of the variable delay gates D(T1) of the paths A11–A14. Because the delay time generation circuit 221 and the paths A11–A14 are arranged proximately, any variation should be of the same level.

Consequently, by controlling the variable delay gates D(T1) of the paths A11–A14 with the same delay time control signal CTR1, it is possible to always have the delay time matching the design value, regardless of variations or alterations in temperature.

Similarly, for the second delay time compensation section 23, the clock f1 is input into the delay time generation circuit 231 and delayed by one cycle. The phases of the output and the original input are then compared using the phase comparison device 232 and a phase error signal generated. This signal is then converted to a DC voltage signal by the low pass filter 233, and serves as the delay time control signal CTR2 for controlling the various variable delay gates D(T2) of the delay time generation circuit 231.

That is, the delay time of the delay time generation circuit 231 is adjusted by using the delay time control signal CTR2 to control the delay times of the various gates, and create an overall delay time equivalent to one cycle of the clock f1.

The delay time generation circuit 231 is located proximately to the paths B11–B14 of system B, and the delay time control signal CTR2 output from the low pass filter 233 is also distributed and supplied to each of the variable delay gates D(T2) of the paths B11–B14. Because the delay time generation circuit 231 and the paths B11–B14 are arranged proximately, any variation should be of the same level.

Consequently, by controlling the variable delay gates D(T2) of the paths B11–B14 with the same delay time control signal CTR2, it is possible to always have the delay time matching the design value, regardless of variations or alterations in temperature.

Furthermore, for those portions which generate delay times less than the delay time of a single variable delay gate D(T1), D(T2), because the paths A11–A12, and B11–B12 are compensated for any variation in construction or temperature, the delay time differences between paths A11 and B11, and between paths A12 and B12 are maintained at the design values, and the resolution of the delay circuit is compensated for any variation in construction and temperature.

In order to generate a specific delay time from the signal input into the delay processing section 21, suitable paths are chosen from the paths A11–A14 and B11–B14, by the various selectors 211–214. The delay times of the various variable delay gates D(T1), D(T2) are adjusted automatically by the delay time control signals CTR1 and CTR2. As a result, the output signal from the delay processing section 21 becomes an extremely accurate delayed signal.

Consequently, for delay circuits constructed in this manner, resolution can be set readily, and extremely accurate delay times can be set by compensating for any construction and temperature variations. Furthermore, in the embodiment shown in FIG. 1, the number of selectors in the delay processing section 21, and the number of variable delay gates in each stage can be increased or decreased as required.

Figure 8:
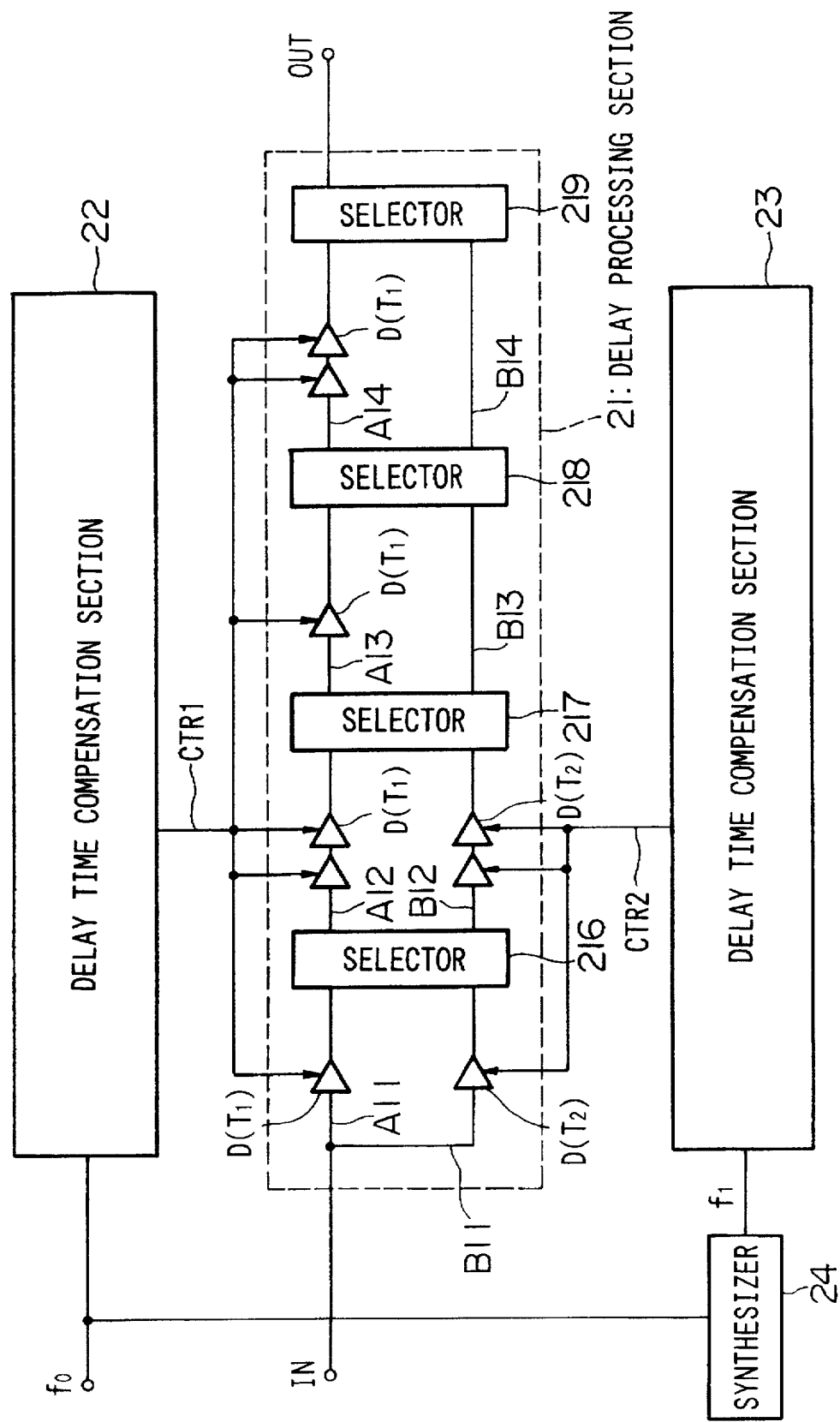
FIG. 8 is a circuit diagram showing the configuration of a seventh embodiment of the invention.

FIG. 8 shows an alternate configuration for the delay circuit of this invention. In this figure, elements which are the same as those in FIG. 7 are labelled identically, and their explanation here is abbreviated. Comparison with FIG. 7 shows clearly that in the delay circuit shown in FIG. 8, the path selection configuration of the delay processing section 21 differs. Namely, the delay processing section 21 contains both two input two output type selectors 216–218 (one of the two inputs produces two outputs), as well as a single input single output selector 219, for the selection of paths A11–A14 and B11–B14.

In FIG. 8, the input signal supplied to the input terminal IN passes directly through both the paths A11 and B11 and is input into the selector 216, where one of the two signals is selected and then output to both the paths A12 and B12.

Similarly, the transmission signals from the paths A12 and B12 are input into the selector 217, where one of the two signals is selected and then output to both the paths A13 and B13. The transmissions signals from the paths A13 and B13 are then input into the selector 218, where one of the two signals is selected and then output to both the paths A14 and B14. The transmissions signals from the paths A14 and B14 are then input into the selector 219, where one of the two signals is selected and then output to the output terminal OUT.

In configurations of this type, as was the case for the embodiment shown in FIG. 7, any variations in the variable delay gates D(T1) of the paths A11–A14 can be compensated for by the delay time compensation signal CTR1 from the first delay time compensation section 22, and any variations in the variable delay gates D(T2) of the paths B11–B14 can be compensated for by the delay time compensation signal CTR2 from the second delay time compensation section 23. Furthermore, the resolution of the delay circuit, calculated as the difference in the delay time between a single variable delay gate D(T1), D(T2) from each of the two delay time generation circuits 221 and 231, can be compensated for any variation due to construction or temperature.

In this type of embodiment, as was the case for the previous embodiments, the number of selectors in the delay processing section 21, and the number of variable delay gates in each stage can be increased or decreased as required. Furthermore, although two path systems were used in all of the embodiments, configurations with a greater number of path systems can also be used. In such cases, as long as a delay time compensation section is provided for each path system, and the input clock for each of the delay time compensation sections is generated from the reference clock by the synthesiser, the same effect can be obtained. A variety of other variations are also possible with this invention.

What is claimed is:

1. A delay circuit comprising:

a delay processing section with paths having from zero to a plurality of variable delay gates provided in m stages and n systems (where m and n are positive integers), and including path selection means for selecting paths between respective stages, delay times of the variable delay gates are set by selectively switching the paths using said path selection means;

a plurality of delay time compensation sections each for receiving an input clock signal and each including delay time generation means provided separately for the system of each path and including variable delay gates identical to the variable delay gates employed in the paths of the respectively corresponding systems of the delay processing section; the variable delay gates being connected in series and arranged proximate to the paths for delaying the input clock signal by one cycle, phase error detection means for detecting a phase difference between an input and output of said delay time generation means, and control signal generation means for generating a delay time control signal from a detection result of said phase error detection means to simultaneously control delay times of the variable delay gates of the delay time generation means and the variable delay gates of the delay processing section in the path of the corresponding system; and a clock generating section for generating from a reference clock, the input clock signal for one of said plurality of delay time compensating sections having a constant frequency relationship to the reference clock, the reference clock coupled as the input clock signal to another of said plurality of delay time compensating sections, said clock generating section being a phase synchronizing loop circuit including a first divider for dividing the reference clock a second divider for dividing an output clock, a phase comparison device for comparing phases of outputs from the first and second dividers to obtain a phase error signal, and clock generation means for generating said output clock as said input clock signal, and controlling a frequency of the output clock to reduce the phase error signal output from said phase comparison device, wherein a delay time resolution of said delay processing section is determined from a ratio of respective divisions of said first and second dividers.

2. A delay circuit according to claim 1, wherein said delay processing section has $2^K$ (K=0, 1, ...) variable delay gates in paths of the same stages of the respective systems, differing for each stage, and connected in series.

3. A delay circuit according to claim 1, wherein said path selection means is a selector.

4. A delay circuit according to claim 1, wherein said phase error detection means is a phase comparison device, and said control signal generation means is a low pass filter.

* * * * *